April 28, 1970 G. SCHAFFNER 3,509,499

VARACTOR TUNED CAVITY

Filed Aug. 9, 1967

INVENTOR
Gerald Schaffner
BY
Mueller, Aichele, & Rauner
Attys

United States Patent Office 3,509,499
Patented Apr. 28, 1970

3,509,499

VARACTOR TUNED CAVITY

Gerald Schaffner, Phoenix, Ariz., assignor to Motorola, Inc., Franklin Park, Ill., a corporation of Illinois

Filed Aug. 9, 1967, Ser. No. 659,387
Int. Cl. H01p *7/06*
U.S. Cl. 333—83 7 Claims

ABSTRACT OF THE DISCLOSURE

Varactor tuned cavity having input and output connection loops on opposite sides of the cavity. A coaxial member extends upwardly from one end of the cavity and is connected to the other end through a varactor diode coaxially disposed inside the cavity. The varactor diode is selected such that its effective capacitance at the midfrequency point is series resonant with the inductance of its leads. Bias means are connected to the coaxial member by an RF isolation means extending perpendicular to the varactor diode. A capacitance is formed between the coaxial member and the cavity shell at the one end such that the coaxial member is electrically floating with respect to the cavity shell.

BACKGROUND OF THE INVENTION

This invention relates to improvements in high frequency tuned cavities and particularly to a tunable cavity which is tuned by a voltage variable capacitance device and has a broad range of tuning.

Tuning circuits in the UHF and VHF range, such as used in television tuners, require a wide band and preferably an electronically selectable frequency. It is known that voltage variable capacitance diodes, commonly referred to as varactors, may be used to tune electrical and electronic circuits. Such varactors when used with tuned cavities require a high Q voltage variable capacitance diode. In using such a diode device to tune a cavity, the inductance associated with a diode package and its leads affects the electronically tuned circuit performance, usually in a degrading manner. In trying to avoid the inductance problems associated with inexpensive glass or plastic encapsulated diodes, the more expensive ceramic diodes packages have been utilized.

The varactor or tuning diode or voltage variable capacitor is a reversed biased rectifying junction in a semiconductor device. By itself such a junction has negligible inductance, the equivalent circuit of the junction at higher frequencies is merely the voltage dependence junction capacitance, $C_J$, with a series resistance, $R_S$. When a package is used to encapsulate the semiconductor wafer, the external contacts give rise to series lead inductance, $L_S$, and the shunting case capacitance, $C_C$. The lead in the form of a strap, wire, whisker, or spring from the junction to the package contacts contributes substantially to this inductance.

The majority of tuned circuits utilize parallel resonant tanks either in lumped or distributed form. The inherent inductance in the varactor when utilized in such tuned circuits lowers the Q of the circuit and therefore its performance. This degradation appears as an insertion loss of the circuit, for example, there can be a degradation of ten percent in such a circuit. This means that the tuning range afforded by a varactor diode with a tuned cavity can be severely limited. In distributed component circuits, such as cavities, the degradation is quite similar to that of lumped component circuits. In design the diode inductance has to be considered. That is, the diode package and lead inductance forms a series resonant circuit with the effective capacitance of the diode.

It is desirable in constructing high volume tuned cavities to use as inexpensive a diode as possible. Heretofore ceramic packages, rather expensive, were required to provide a broad tuning range in tuned cavities. It is desired that tuning diodes such as housed in a DO–7 glass package or a plastic encapsulated package be usable with tuned cavities.

SUMMARY OF THE INVENTION

It is an object of this invention to provide a voltage tunable cavity structure having a wide tuning range and utilizing inexpensive semiconductor diodes.

It is a further object of this invention to provide a tunable cavity with a varactor semiconductor device in which the inherent inductance of the device is substantially compensated for and so does not materially enter circuit operation.

A feature of the present invention includes a voltage fariable capacitance semiconductor device disposed in a tunable cavity coaxial with the shell and extending from the shell to a floating coaxial member inside the cavity. Another feature is the inclusion of a capacitance between the floating member and the shell opposite to the voltage variable device. Another feature is the placement of the input output inductive loop opposite the voltage variable semiconductor device. Another feature is the provision of bias means extending to the coaxial member perpendicularly to the disposition of the semiconductor device. Another feature of the invention includes the placement of the tuning semiconductor device in juxtaposition to the input and output inductive loops.

THE DRAWING

DESCRIPTION OF THE ILLUSTRATIVE EMBODIMENT

Figure 1:
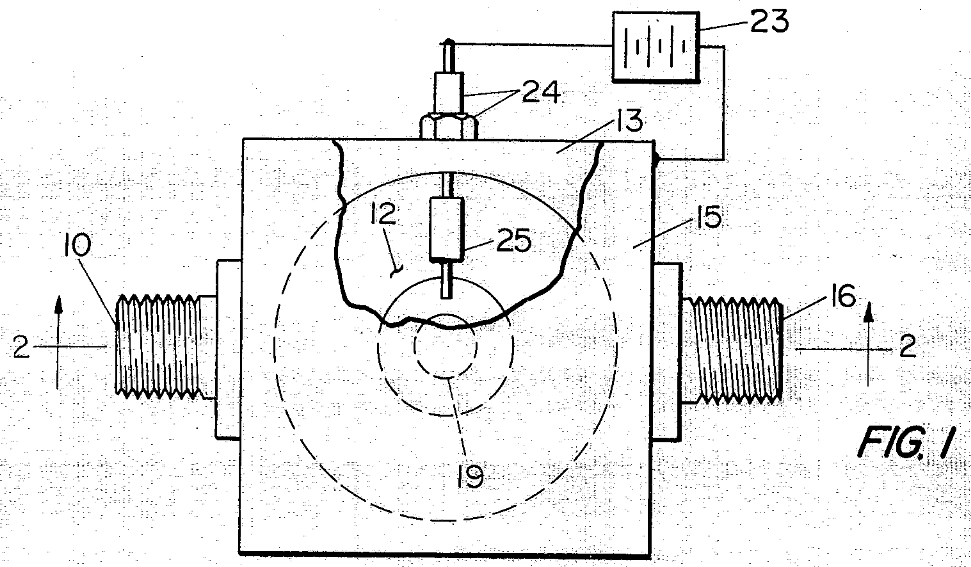
FIG. 1 is a plan view of one apparatus embodying the teachings of the present invention.
Figure 2:
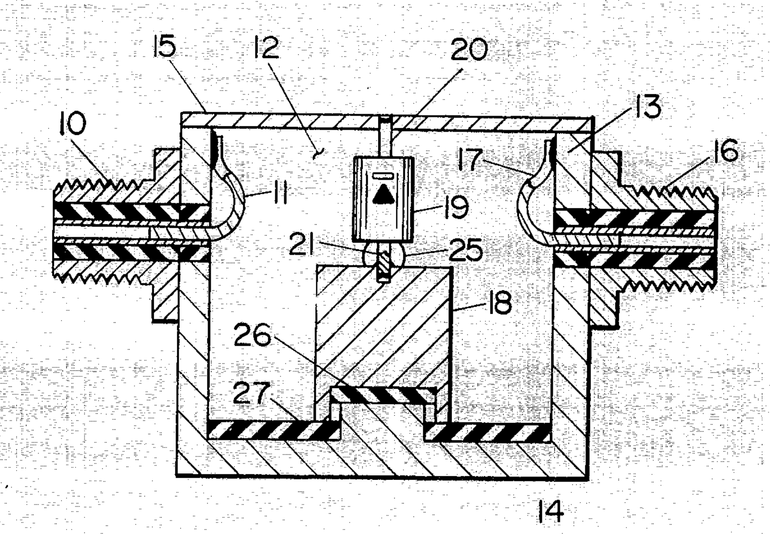
FIG. 2 is a cross-sectional view taken in the direction of the arrows along line 2—2 in FIG. 1.

Referring more particularly to the drawings like numbers indicate like parts and structural features in the two views and in the schematic diagram. Input coaxial connector 10 supplies signals to inductive input loop 11 disposed inside cavity 12 formed by tubular shell 13 formed of electrically conductive material. Tubular shell 13 has a first closed end 14 and a removable cover 15 at the opposite end. The output connection is through coaxial connector 16 which receives signals from cavity 12 through output inductive loop 17 which is preferably disposed on the same diameter as input loop 11, as best seen in FIG. 1. As later more fully described, a one-half wave length cavity-type line is formed by electrically floating center conductive member 18 disposed coaxially inside cavity 12. Member 18 is disposed slightly below the input and output inductive loops 11, 17. A varactor semiconductive tuning device or diode 19 has a pair of leads 20 and 21 extending in opposite directions and respectively electrically connected to cover 15 and to member 18 as best seen in FIG. 2. Leads 20 and 21 especially the lead portion inside the encapsulating case of diode 19 provides series inductance 22 (FIG. 3) integrally with diode 19 as is known.

Figure 3:
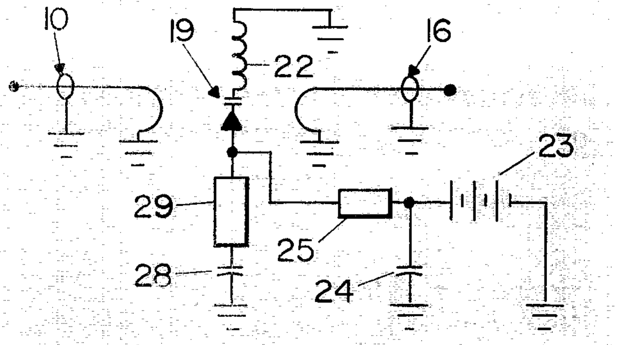
FIG. 3 is an equivalent schematic circuit diagram of the FIGURE 1 apparatus.

The bias circuit for reverse biasing the rectifying junction of diode 19 may be provided by a battery source 23 having its negative terminal grounded, as schematically shown in FIGURE 1, to shell 13. Its positive terminal is connected to member 18 through feedthrough capacitor assembly 24, of known design, and thence through an RF choke 25 which is connected between capacitor 24 and member 18. It is preferred that choke 25 extend perpendicularly with respect to diode 19 and as best seen in FIGURE 1. The device is completed by a relatively large capacitor, which may be fixed or variable, formed by insulative layer 26 and insulating collar 27 disposed between end portion 14 of shell 13 and member 18 as best seen in FIGURE 2. The effective capacitance of layer 26 and collar 27 is represented in FIGURE 3 as capacitor 28, the one-half wave length line formed by member 18 and shell 13 as represented in FIGURE 3 by block symbol 29. While layer 26 is shown as providing a fixed capacitance, in a practical embodiment a variable capacitance structure of known design can be used.

An experimental model of the illustrative embodiment was constructed and tested to determine the effective tuning range and designability of such a device. Close agreement between calculated values and performance of the experimental device clearly showed a broad tuning range with the tunable cavity utilizing a 1N5139 glass encapsulated diode. In the experimental model the tuning range was arbitrarily selected to be from 470 mHz. to 890 mHz. (megahertz). By keeping the series tuned capacitance formed by layer 26 and collar 27 in series with the capacitance of varactor diode 19 as large as possible, the voltage variable junction capacitor controlled the resonant frequency of the assembly to the greatest possible extent. In constructing the embodiment the ratio of the maximum to the minimum capacitance for the tuning range was kept greater than the square of the ratio of the frequencies of the tuning range. In the example, the ratio of $(890 \text{ to } 470)^2$ is equal to 3.58 (this is $1.89^2$). For the 1N5139, the junction capacitance at a reverse bias of 1 volt yielded a junction capacitance of 10.2 pf. (picofarads) while a minimum capacitance at a reverse bias of 60 volts yielded 2.2 pf. The ratio of maximum to minimum capacitance was 4.64.

At the mean frequency of the frequency range the lead length of the varactor was selected such that the inherent inductances were self-resonant with the junction capacitance at its mean value. In the constructed embodiment, the 1N5139 mean capacitance between the reverse bias of 1 volt and 60 volts is 4.8 pf. occurring at 10 volts reverse bias. The inductance required to resonate with 4.8 pf. at the mean frequency of 650 mHz. requires an inductance of 12.5 nh. (nanohenries). Lead inductance of this diode is 27 nh. per inch and with a 3 nh. internal varactor inductance. Calcualtions showed that required lead length was 0.35 inch.

For a broad tuning range a low characteristic impedance for the transmission line portion of the cavity is desired, i.e. that portion adjacent member 18. A low characteristic impedance includes impedances between 20 and 40 ohms, for example. In the constructed embodiment, the characteristic impedance was selected to be 30 ohms. For a coaxial line (member 18 to shell 13) having an outer diameter of 1 inch and an inner diameter of 0.6 inch characteristic impedance turns out to be 30 ohms.

One should also determine the minimum allowable equivalent transmission line capacity which is in series with the capacitance of the varactor. The first step is to determine the cavity resonance at the frequency band limits of, for example 470 and 890 mHz. This step can be done using known expressions for determination of frequency in accordance with series connected capacitance as provided by the varactor 19 and capacitors 26, 27 in series therewith. In the constructed example, the minimum capacitance to be provided by layer 26 and collar 27 was calculated to be 24.5 pf. (Note: This also includes the effective capacitance of the line.)

The electrical length $\theta$ at the mean frequency is determined. In the example, at the mean frequency of 650 mHz. the electrical length of the line without capacity loading provided by layer 26 and collar 27 was determined to be 0.34 radian or 19.6 degrees. From the electrical length the physical length is determined by the equation:

$$L=\theta\lambda/2\pi \quad (1)$$

where $\lambda$ is the mean frequency wave length. In the above example the physical length was calculated to be 0.98 inch, therefore the distance from the top of member 18 as viewed in FIGURE 2 to the inner edge of end portion 14 was 0.98 inch.

Next, the loading capacity of the line was determined to be equal to 23 pf. Therefore the transmission line formed by member 18 and shell 13 is a capacity loaded open circuit one-half wave length line. It is desired that the characteristic impedance and the electrical length $\theta$ be kept as small as possible which means that the end capacity or the capacity loading should be large. Further when the junction capacitance of diode 19 and the series lead inductance are made series resonant the mean frequency maximum tuning range is obtained when the other above mentioned criteria are met.

From inspection of the equivalent circuit in FIGURE 3 as well as the constructed illustrated embodiment it is seen that the series inductance 22 of diode 19 will not appear as an insertion loss between the input and output connections 10 and 16.

What is claimed is:

1. Microwave structure having a cavity formed in a conductive tubular shell with input and output connections in a first end portion of the cavity and having first and second ends,
- the improvement including in combination,
- a center conductive member disposed coaxially inside the cavity and having third and fourth ends and forming a tuned portion in the cavity,
- a capacitor forming means disposed between the second end and said member third end,
- a variable capacitance semiconductive device disposed between said member fourth end and the shell first end and disposed in said one end portion and having opposite electrical leads respectively connected to said shell and member, and
- RF isolation means electrically coupled to the lead of said semiconductive device which is connected to the center member, said isolation means extending radially from the fourth end of said center member toward and insulated from said shell for providing bias circuit connections for said device.

2. The structure of claim 1 wherein said device has leads with an inductance, the effective capacitance of said device being resonant with said inductance at a frequency which is the mean frequency of a band of frequencies in which the structure is to be operated.

3. The structure of claim 2 wherein said cavity has a low characteristic impedance.

4. The structure of claim 2 wherein said input and output connection means each comprise an inductive loop disposed at opposite ends of one diameter inside said shell and located in juxtaposition to said device in said one end portion.

5. The structure of claim 4 wherein said capacitance forming means comprises a layer of insulative material.

6. The structure of claim 5 wherein said shell has a circular cross-section and said device has leads disposed on the central axis of the cylindrical shell with the device having oppositely extending leads of equal length.

7. The structure of claim 6 wherein said tuned portion has an effective electrical length equal to approximately one-half the wave length of a center frequency in said band of frequencies.

References Cited

UNITED STATES PATENTS 3,108,239 10/1963 Kouerter ------------ 333—83

HERMAN KARL SAALBACH, Primary Examiner

L. ALLAHUT, Assistant Examiner